United States Patent
Tanaka et al.

(10) Patent No.: US 7,219,543 B2
(45) Date of Patent: May 22, 2007

(54) SENSOR DEVICE HAVING MOLDED SIGNAL-OUTPUTTING PORTION

(75) Inventors: Masaaki Tanaka, Kariya (JP); Hiromi Ariyoshi, Kariya (JP); Tiaki Mizuno, Toyota (JP)

(73) Assignee: DENSO Corporation, Kariya (JP)

( * ) Notice: Subject to any disclaimer, the term of this patent is extended or adjusted under 35 U.S.C. 154(b) by 78 days.

(21) Appl. No.: 11/142,192

(22) Filed: Jun. 2, 2005

(65) Prior Publication Data
US 2005/0279919 A1    Dec. 22, 2005

(30) Foreign Application Priority Data
Jun. 18, 2004 (JP) .............................. 2004-181083

(51) Int. Cl.
*G01F 1/68* (2006.01)

(52) U.S. Cl. .................................................. 73/204.22
(58) Field of Classification Search ............. 73/204.22, 73/204.26, 118.2
See application file for complete search history.

(56) References Cited

U.S. PATENT DOCUMENTS

| | | | | |
|---|---|---|---|---|
| 5,396,795 A | * | 3/1995 | Araki .................... | 73/204.26 |
| 5,631,416 A | * | 5/1997 | Rilling et al. .......... | 73/204.22 |
| 5,723,784 A | * | 3/1998 | Lembke et al. ......... | 73/204.26 |
| 6,176,131 B1 | | 1/2001 | Hecht et al. | |
| 2003/0233886 A1 | | 12/2003 | Uramachi et al. | |
| 2004/0058589 A1 | | 3/2004 | Satou et al. | |

FOREIGN PATENT DOCUMENTS

| | | |
|---|---|---|
| JP | A-H11-6752 | 1/1999 |
| JP | A-2000-002572 | 1/2000 |

* cited by examiner

*Primary Examiner*—Jewel Thompson
(74) *Attorney, Agent, or Firm*—Posz Law Group, PLC

(57) ABSTRACT

A sensor device is composed of a sensor element having a sensing portion, and a signal-outputting portion mounted on a substrate. The sensor element is also mounted on the substrate via a resilient material. The sensor element is electrically connected to the signal-outputting portion through a bonding wire. The work consisting of the sensor element, signal-outputting portion and the substrate is held in a molding die, and the work is molded with an insulating material, while keeping the sensing portion exposed outside of the insulating material. A depressed portion of the molding die, in which the sensor element is accommodated in the molding process, has substantially no clearance relative to the sensor element, and the sensor element is led to the depressed portion by resiliency of the material bonding the sensor element to the substrate. Therefore, no burs are formed on the sides of the sensor element in the molding process.

10 Claims, 4 Drawing Sheets

SENSOR DEVICE HAVING MOLDED SIGNAL-OUTPUTTING PORTION

CROSS-REFERENCE TO RELATED APPLICATION

This application is based upon and claims benefit of priority of Japanese Patent Application No. 2004-181083 filed on Jun. 18, 2004, the content of which is incorporated herein by reference.

BACKGROUND OF THE INVENTION

1. Field of the Invention

The present invention relates to a sensor device having a sensor element and a signal-outputting portion electrically connected to the sensor element. The sensor device is used for measuring an amount of air supplied to an internal combustion engine, for example.

2. Description of Related Art

Examples of this kind of airflow sensors for measuring an amount of air supplied to an internal combustion engine are disclosed in JP-A-7-174599 and JP-A-11-6752. The airflow sensor includes a sensing element and a signal-outputting portion electrically connected to the sensing element. The portion electrically connecting the sensing element to the signal-outputting portion is molded, while a sensing portion of the sensor element is exposed to the airflow to be measured.

In a process of manufacturing the sensor device, the sensor element and the signal-outputting portion is electrically connected, and then the sensor element and the signal-outputting portion are contained in a molding die. Then, the portion connecting the sensor element to the signal-outputting portion is molded in the molding die with a resin material. Because the connecting portion to be molded is contained in a cavity in the molding die having a certain clearance or a gap, some burs are formed on sides of the connecting portion.

This problem will be further explained, referring to FIGS. 7A, 7B and 7C showing a process of manufacturing a conventional sensor device. As shown in FIGS. 7A and 7B, a sensor element 20 having a sensing portion 21, and a circuit chip forming a signal-outputting portion 31 are mounted on a substrate 10. The sensor element 20 is electrically connected to the signal-outputting portion 31 with a bonding wire 22. A portion connecting the sensor element 20 to the signal-output portion 31 including the bonding wire 22 and the signal-outputting portion 31 are molded with a molding insulator 50.

As shown in FIG. 7C, after the sensor element 20 and the signal-outputting portion 31 are electrically connected through the bonding wire 22, the sensor element 20 is contained in a depressed portion 240 of a molding die 200 consisting of a lower die 210 and an upper die 220. Then, the connecting portion and the signal-outputting portion 31 is molded with the insulating material 50, while exposing the sensing portion 21 outside of the insulating material 50. Since a certain gap, or a clearance, G is necessary in the depressed portion 240 for accommodating the sensing element 20 therein, some of the molding insulator 50 forms burs on the sides of the sensing portion 20 in the molding process.

The gap G is necessary because the sensor element 20 is fixedly mounted on the substrate 10 and the sensor element 20 is not movable relative to the substrate 10. The burs formed on the sides of the sensor element 20 change a heat capacity of the sensor element 20, and such a change in the heat capacity affects an output of the sensor device. If the sensor device is used as an airflow sensor measuring an amount of air based on a temperature of the sensor element, the changes in the heat capacity is detrimental to the sensor output. If the sensor device is used as a diaphragm-type pressure sensor, a distortion of the diaphragm is affected by the burs formed on the sides of the sensor element. Therefore, it is necessary to eliminate or reduce such burs in the molding process.

SUMMARY OF THE INVENTION

The present invention has been made in view of the above-mentioned problem, and an object of the present invention is to provide an improved sensor device, in which formation of the burs on the sides of the sensor element is eliminated or suppressed in the molding process. Another object of the present invention is to provide a method of manufacturing such a sensor-device.

The sensor device according to the present invention is used, for example, as an airflow sensor for measuring an amount of air supplied to an internal combustion engine. The sensor device is composed of a substrate, a sensor element having a sensing portion, and a signal-outputting portion for taking out electrical signals from the sensor element. The sensor element is mounted on the substrate via a resiliently deformable material, and the signal-outputting portion is mounted on the substrate. The sensor element is electrically connected to the signal-outputting portion through a bonding wire, for example. A portion electrically connecting the sensor element to the signal-outputting portion and the signal-outputting portion are molded with an insulating material, while keeping the sensing portion of the sensor element exposed out of the insulating material. By mounting the sensor element on the substrate in this manner, the sensor element forms a cantilever structure.

In a manufacturing process, the sensor element and the signal-outputting portion are mounted on the substrate, and then both are electrically connected through a bonding wire. Then, a work consisting of the sensor element, the signal-outputting portion and the substrate is held in a molding die that includes a depressed portion for accommodating the sensor element therein. The sensing portion of the sensor element is kept outside of the molding die. Then, the electrically connecting portion and the signal-outputting portion are molded together with an insulating material, while keeping the sensing portion exposed outside of the insulating material.

The depressed portion in the molding die has substantially no clearance or gap relative to the sensor element. The sensor element is correctly positioned in the depressed portion, utilizing resiliency of the resiliently deformable material that bonds the sensor element to the substrate. Since there is no clearance or gap in the depressed portion in the molding die, formation of burs on sides of the sensor element in the molding process is avoided. A guiding taper may be formed in the molding die for smoothly guiding the sensor element into the depressed portion. A buffer member may be disposed between the depressed portion and the sensor element to alleviate stresses imposed on the sensor element in the molding process.

Other objects and features of the present invention will become more readily apparent from a better understanding of the preferred embodiment described below with reference to the following drawings.

DETAILED DESCRIPTION OF THE PREFERRED EMBODIMENT

Figure 1:
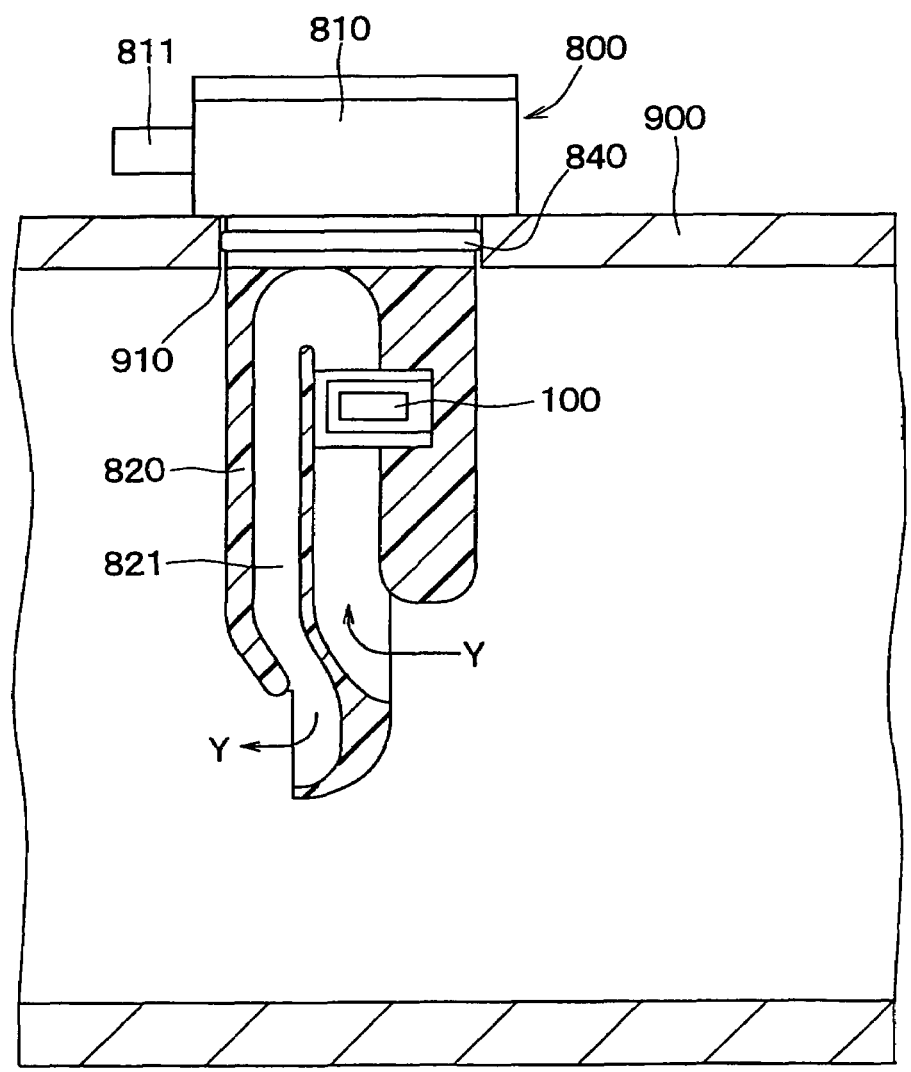
FIG. 1 is a cross-sectional view showing an airflow sensor mounted inside of an intake pipe of an internal combustion engine.

A preferred embodiment of the present invention will be described with reference to FIGS. 1–6. A sensor device of the present invention is used as a heat-sensitive airflow sensor for measuring an amount of air flowing through an intake pipe of an internal combustion engine. As shown in FIG. 1, a passage-forming member 820 is installed inside of an intake pipe 900 of an internal combustion engine. The passage-forming member 820 is connected to a mounting hole 910 of the intake pipe 900 with a sealing member 840 such as an O-ring.

An airflow-measuring device 800 is composed of a circuit module 810 having an electrical connector 811 and an airflow sensor 100. The circuit module 800 is mounted outside of the intake pipe 900, and the airflow sensor 100 is mounted on the passage-forming member 820 mounted inside of the intake pipe 900. A bypass passage 821, through which an airflow bypassing a main passage flows, is formed in the passage-forming member 820, and the airflow sensor 100 is positioned so that it is exposed to the bypassing airflow.

The circuit module 810 includes a circuit for processing electrical signals received from the airflow sensor 100, and the processed signals are fed to an outside electronic control unit (not shown) through the electrical connector 811. The airflow bypassing the main passage in the intake pipe 900 flows through the bypass passage 821 along a line Y shown in FIG. 1. The airflow sensor 100 generates electrical signals representing an amount of air flowing through the intake pipe 900. The signals from the airflow sensor 100 are fed to the circuit module 810, and the signals processed in the circuit-module are further fed to the outside electronic control unit through the connector 811.

A sensor device 100 (which is used as the airflow sensor as shown in FIG. 1) will be described in detail with reference to FIGS. 2–4. The sensor device 100 includes a substrate 10, a sensor element 20 and a signal-outputting portion 30 having a circuit element 31. A reed frame, a ceramic plate or the like can serve as the substrate 10. In this particular embodiment, an island portion of a reed frame is used as the substrate 10. The sensor element 10 has a thin sensing portion 21 at its one end (the left end in FIG. 2), and the other end (the right end) of the sensor element 20 is mounted on the substrate 10 via a resiliently deformable material 40 serving as adhesive. A heat-responsive resistor or the like is formed on the thin sensing portion 21, so that a resistance of the resistor changes according to an amount of air to which the sensing portion 21 is exposed. The sensor element 20 may be formed as a semiconductor chip using known semiconductor manufacturing processes.

Since the sensor element 20 is mounted on the substrate 10 via the resiliently deformable adhesive 40, the sensor element 20 is movable relative to the substrate 10. Therefore, the sensor element 20 is accommodated in a depressed portion 240 of the molding die 200 (explained later in detail) even if no gap G is provided in the depressed portion 240. Various insulating adhesives that are resiliently deformable after bonding, such as rubber adhesive or gel adhesive, may be used as the resiliently deformable adhesive 40. More particularly, adhesives made of silicone rubber, fluorine-rubber, silicone-gel-rubber, fluorine-gel or the like may be used as the resiliently deformable adhesive 40. It is also possible to use a fluoro-silicone-type adhesive. It is preferable to make a thickness of the resiliently deformable adhesive 40 thicker than 100 µm to secure a sufficiently high resiliency. In a conventional sensor device, a thickness of the adhesive connecting the sensor element to the substrate is about 20–30 µm or thinner.

The signal-outputting portion 30 having a circuit element 31 is separated from the sensor element 20 and is mounted on lead portions 32 of the substrate 10 with adhesive 34 made of an insulating material such as resin or ceramics. The signal-outputting portion 30 is electrically connected to the sensor element 20 through the bonding wire 22. Signals from the sensor element 20 are processed in the circuit element 31 to a proper form to be supplied to the outside. The circuit element 31 may be formed in a form of a semiconductor chip manufactured by known processes.

The substrate 10 is formed by a reed frame having lead portions 32 that extend to the outside of the insulating material 50. The signal-outputting portion 30 is electrically connected to the lead portions 32 through bonding wires 33 as shown in FIG. 4. The output signals of the sensor device 100 are taken out from the lead portions 32. The reed frame may be made of copper that is usually used in electronic devices, a 42-alloy or the like. The bonding wires 22, 33 may be made of gold, aluminum or the like.

Figure 2:
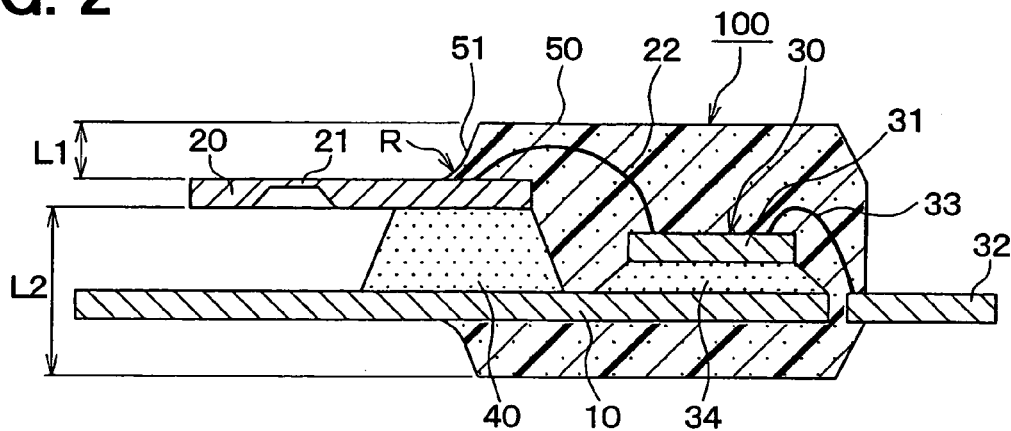
FIG. 2 is a cross-sectional view showing a sensor device having a sensor element and a signal-outputting portion.
Figure 3:
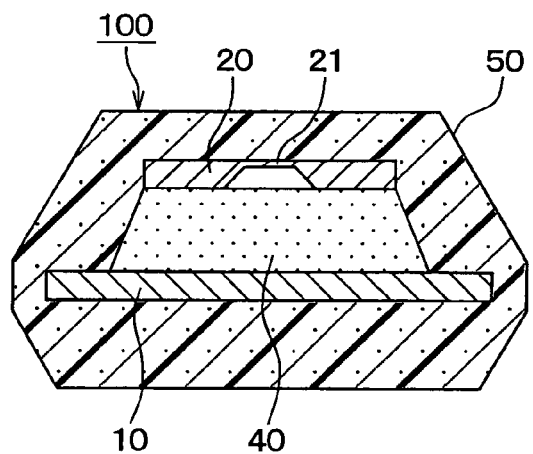
FIG. 3 is a cross-sectional view showing the same sensor device as shown in FIG. 2, viewed from the left side of FIG. 2.

As shown in FIG. 2, the portion connecting the sensor element 20 to the signal-outputting portion 30 including the bonding wire 22, and the signal-outputting portion 30 are encapsulated with the molding insulator 50. The sensing portion 21 of the sensor element 20 is not covered with the molding insulator 50 but is exposed outside thereof. In FIG. 4, the molding insulator 50 is shown with a dotted line, and the lead portions 32 extends outside of the molding insulator 50. As better seen in FIG. 2, the sensor element 20 is supported at one end, forming a cantilever structure. Various resin materials, such as epoxy resin that is usually used in a molding process, can be used as the molding insulator 50.

A dimension L1 from an upper surface of the molding insulator 50 to an upper surface of the sensor element 20 and another dimension L2 from a lower surface of the sensor element 20 to a lower surface of the molding insulator 50 are shown FIG. 2. In FIG. 2, it is shown that L2 is considerably larger than L1 to clearly show the resiliently deformable adhesive 40. In the actual device, however, L1 is roughly equal to L2. In other words, the sensor element 20 is positioned substantially at a center of the sensor device 100 in its thickness direction. In this manner, stresses imposed on the sensor element 20 from the upper and the lower surfaces can be equalized.

Figure 4:
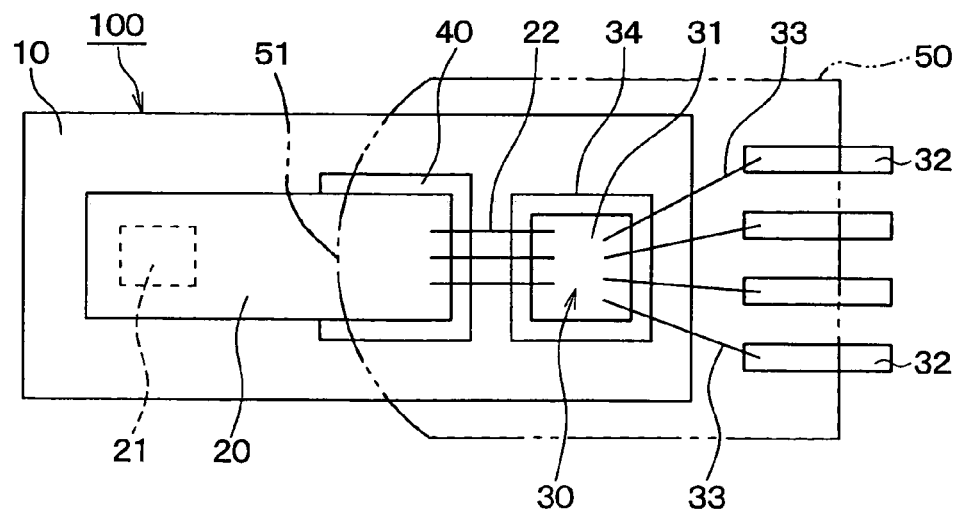
FIG. 4 is a plan view showing the sensor device, viewed from the top as if a molding insulator were transparent.

As shown in FIG. 4, a front edge (at the left side) of the molding insulator 50 is circularly curved, and as shown in FIG. 2, a front surface (a vertical surface at the left side) is curved with a radius R. It is preferable to make such a curved edge and a curved surface on the molding insulator 50 to alleviate stresses imposed thereon.

Figure 5:
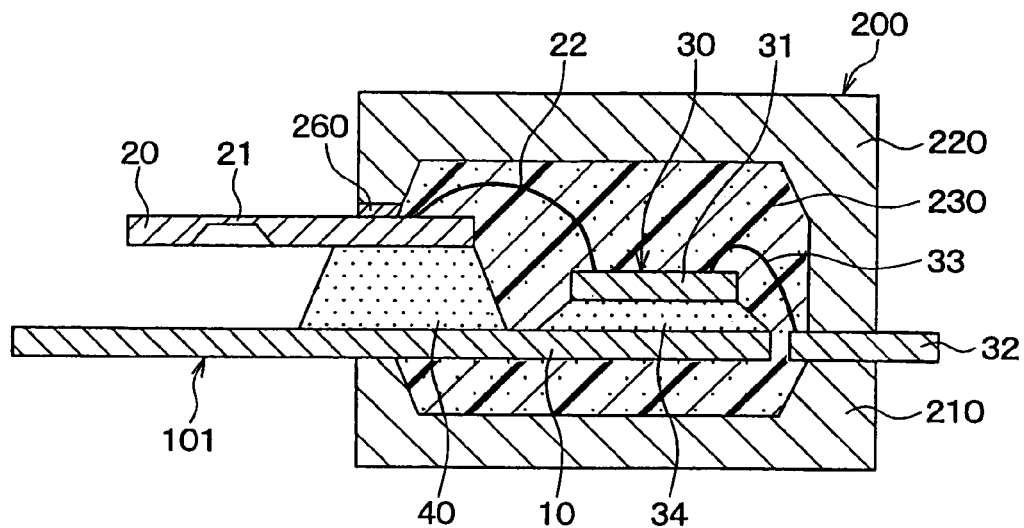
FIG. 5 is a cross-sectional view showing the sensor device contained in a molding die.
Figure 6:
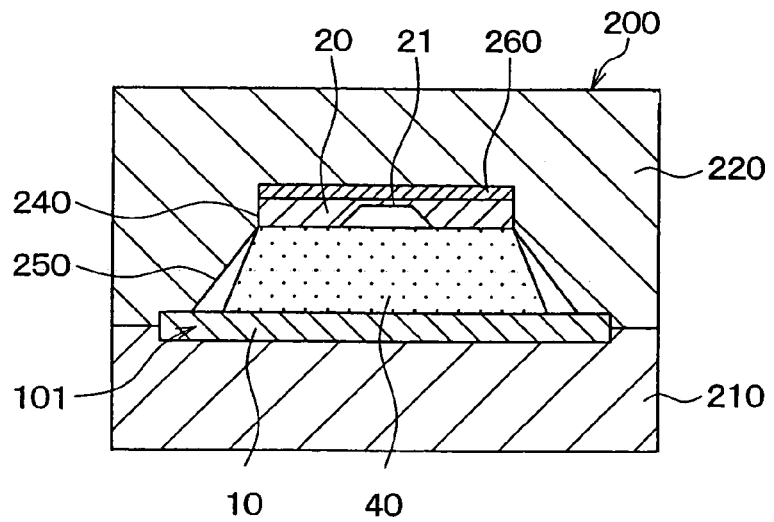
FIG. 6 is a cross-sectional view showing the sensor device contained in the molding die, viewed from the left side of FIG. 5.
Figure 7A:
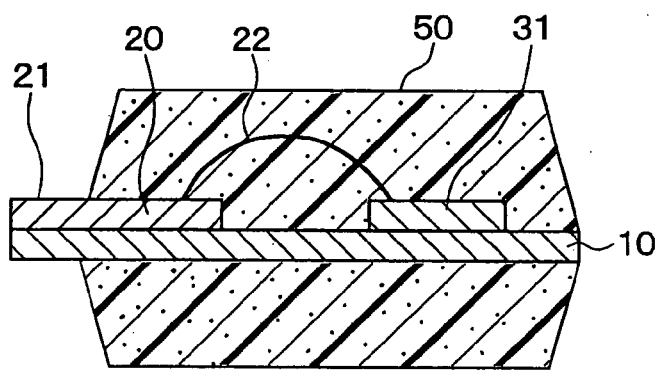
FIGS. 7A is a cross-sectional view showing a conventional sensor device.
Figure 7B:
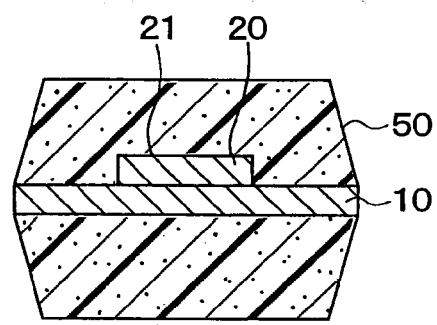
FIG. 7B is a cross-sectional view showing the conventional sensor device, viewed from the left side of FIG. 7A.
Figure 7C:
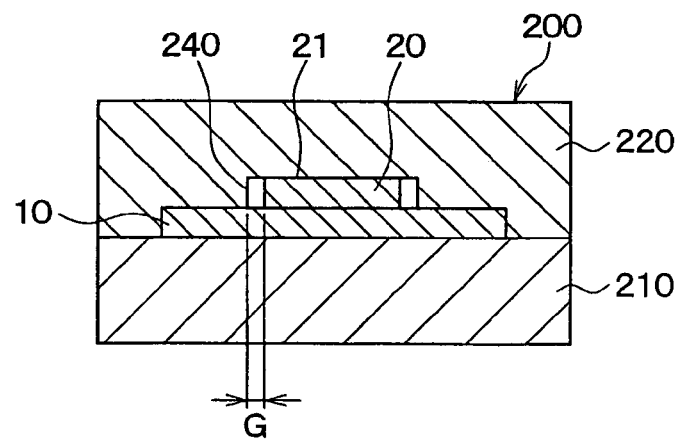
FIG. 7C is a cross-sectional view showing the conventional sensor device contained in a molding die.

With reference to FIGS. 5 and 6, a process of manufacturing the sensor device 100 will be described. First, the sensor element 20 is mounted on the substrate 10 via the resiliently deformable adhesive 40, and the signal-outputting portion 30 is mounted on the substrate 10 with the adhesive 34. Then, the sensor element 20 is electrically connected to the signal-outputting portion 30 through the bonding wire 22, and the signal-outputting portion 30 is electrically connected to the lead portions 32 of the substrate 10 through the bonding wires 33.

A work 101 thus formed is positioned on a lower die 210, and then an upper die 220 is placed to cover the work 101. The upper die 220 has a depressed portion 240 for accommodating the sensor element 20 therein. In placing the upper die 220 on the work 101, the position of the sensor element 20 relative to the substrate 10 is adjusted by the resiliency of the resiliently deformable adhesive 40, so that the sensor element 20 is correctly accommodated in the depressed portion 240 of the upper die 220. The depressed portion 240 has substantially no clearance or gap (which is formed in the conventional molding die) relative to the width of the sensor element 20 to minimize molding burs formed on the sides of the sensor element 20.

Thus, the work 101 is contained in the molding die 200, while the sensing portion 21 of the sensor element 20 and a part of the substrate 10 are kept exposed outside of the molding die 200. A cavity 230 to be filled with the molding insulator 50 is formed between the work 101 and the molding die 200. Then, the molding material is forcibly supplied into the cavity 230 to encapsulate the work 101 with the molding insulator 50. The sensing portion 21 of the sensor element 20 is kept exposed outside of the molding insulator 50. After the molding insulator 50 is solidified, the work 101 is taken out of the molding die 200.

As shown in FIG. 6, a tapered surface 250 (a guiding surface) for correctly guiding the sensor element 20 into the depressed portion 240 is formed in the upper die 220. The sensor element 20 resiliently mounted on the substrate 10 is guided by the tapered surface 250 and is correctly positioned in the depressed portion 240. It is preferable to dispose a buffer member 260 on the bottom surface of the depressed portion 240 where the upper surface of the sensor element 20 contacts the upper die 220. Stress imposed on the sensor element from the molding die is alleviated by the buffer member 260. The buffer member 260 may be formed by covering the bottom surface of the depressed portion 240 with PIQ (polyimide), light-hardening resin, resist or the like. Alternatively, the upper surface of the sensor element 20 contacting the bottom surface of the depressed portion 240 may be covered with a resilient member.

In the process of containing the work 101 in the molding die 200, the position of the sensor element 20 relative to the substrate 10 is adjusted by the resiliency of the adhesive 40 connecting the sensor element 20 to the substrate 10. Therefore, the sensor element 20 can be correctly positioned in the depressed portion 240 of the upper die which has no clearance or gap relative to the width of the sensor element 10. Since there is substantially no clearance between the depressed portion 240 and the sensor element 20, no burs are formed on the sides of the sensor element in the molding process.

The clearance or the gap between the depressed portion 240 and the sensor element 20 can be made as small as 20–30 µm according to the present invention. This means that the clearance is reduced to one-tenth of the conventional one according to the present invention. It has been necessary to make a clearance of about 0.3 mm in the conventional die. As a result, formation of the molding burs on the sides of the sensor element 20 is suppressed to substantially zero. Accordingly, the sensing portion 21 exposing from the molding insulator 50 is not adversely affected by the molding burs.

Since the sensor element 20 is positioned at a center portion of the molding insulator 50 in its thinness direction as mentioned above, stress generated when the molding insulator 50 is hardened is uniformly imposed on the sensor element 20. Therefore, the sensor element 20 is protected from being damaged by the stress imposed thereon. The end line of the end surface 51 of the molding insulator 50 is circularly curved, as shown in FIG. 4 with a dotted line. The curved line alleviates the stress imposed on the sensor element 20 from the molding insulator 50. Further, the end surface 51 of the molding insulator 50 has a concave radius R as shown in FIG. 2. This concave radius R also serves to alleviate the stress imposed on the sensor element 20 from the molding insulator 50 when the molding insulator 50 is hardened.

In the molding process, the sensor element 20 is correctly guided into the depressed portion 240 of the upper molding die 220 by the resiliency of the adhesive 40 with which the sensor element 20 is boned to the substrate 10. The gap G or the clearance relative to the sides of the sensor element 20, which was necessary in the conventional molding die, is eliminated. Therefore, molding burs are prevented from being formed on the sides of the sensor element 20. By forming the guiding taper 250 in the upper molding die 220 as shown in FIG. 6, the sensor element 20 is further smoothly guided into the depressed portion 240. By disposing the buffer member 260 between the upper surface of the sensor element 20 and the upper molding die 220 (refer to FIGS. 5 and 6), the stresses imposed on the sensor element 20 from the molding die 200 in the molding process can be further alleviated.

The present invention is not limited to the embodiment described above, but it maybe variously modified. For example, the sensor element 20 and the circuit element 31 can be integrally formed on a single semiconductor chip, though they are separated in the foregoing embodiment. The sensor element 20 connected to the substrate 10 may not be limited to only one. Plural sensor elements 20 maybe aligned in a direction parallel to the surface of the substrate 10. In this case, each sensor element 20 is mounted on the substrate 10 via the resiliently deformable adhesive 40, and the signal-outputting portion 30 and the portion electrically connecting the sensor elements to the signal-outputting portion 30 are molded together with the molding insulator 50, while exposing each sensing portion 21 of the sensor element 20 to the outside of the molding insulator 50.

The molding insulator 50 is not limited to the epoxy resin, but various materials can be used as long as such materials are able to be molded by the molding die. The electrical connections between the sensor element 20 and the signal-outputting portion 30 and between the signal-outputting portion 30 and the lead portions 32 may be made by various manners other than the bonding wires 22 and 33 used in the foregoing embodiment. The present invention may be applied to various semiconductor sensors other than the airflow sensor, such as a humidity sensor, a gas sensor, an optical sensor, a tire pressure sensor and a sensor for a diesel particulate filter.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A sensor device comprising:
   a substrate;
   a sensor element having a sensing portion, the sensor element being mounted on the substrate via a resiliently deformable material; and
   a signal-outputting portion electrically connected to the sensor element, the signal-outputting portion being mounted on the substrate, wherein:
   a portion electrically connecting the sensor element to the signal-outputting portion is molded with an insulating material, while the sensing portion of the sensor element being exposed outside of the insulating material.

2. The sensor device as in claim 1, wherein:
   the insulating material is a resin material.

3. The sensor device as in claim 1, wherein:
   the sensor element and the signal-outputting portion are electrically connected by a bonding wire.

4. The sensor device as in claim 1, wherein:
   the substrate is a reed frame.

5. The sensor device as in claim 4, wherein:
   the signal-outputting portion is electrically connected to the reed frame, so that its outputs are outputted through the reed frame.

6. The sensor device as in claim 1, wherein:
   the sensing portion is formed at one end of the sensor element, and the other end of the sensor element is electrically connected to the signal-outputting portion; and
   the other end of the sensor element is mounted on the substrate via the resiliently deformable adhesive and molded with the insulating material, thereby the sensor element forming a cantilever structure.

7. The sensor device as in claim 1, wherein:
   the sensor element is positioned in a center portion of the sensor device in its thickness direction.

8. The sensor device as in claim 1, wherein:
   the signal-outputting portion includes a circuit element mounted on the substrate; and
   the sensor element and the circuit element are formed as respective semiconductor chips separated from each other.

9. The sensor device as in claim 1, wherein:
   an end line of an and surface of the molded insulating material, the end line being defined by contact of the insulating material with the sensor element on a surface of the sensor element, is curved.

10. The sensor device as in claim 1, wherein:
    an end surface of the molded insulating material, the end surface being substantially perpendicular to a surface of the sensor element, is a surface having a concave radius.

* * * * *